United States Patent
Eglin et al.

(10) Patent No.: US 8,600,694 B2
(45) Date of Patent: Dec. 3, 2013

(54) PROCESSING OF A SIGNAL REPRESENTING RADIATION

(75) Inventors: Luc Eglin, Paris (FR); Eric Barat, Limours (FR)

(73) Assignee: Commissariat a l'Energie Atomique, Paris (FR)

( * ) Notice: Subject to any disclaimer, the term of this patent is extended or adjusted under 35 U.S.C. 154(b) by 1175 days.

(21) Appl. No.: 11/995,451

(22) PCT Filed: Jul. 12, 2006

(86) PCT No.: PCT/EP2006/064163
§ 371 (c)(1),
(2), (4) Date: Mar. 26, 2008

(87) PCT Pub. No.: WO2007/006801
PCT Pub. Date: Jan. 18, 2007

(65) Prior Publication Data
US 2008/0215267 A1 Sep. 4, 2008

(30) Foreign Application Priority Data
Jul. 12, 2005 (FR) ..................................... 05 07451

(51) Int. Cl.
*G01R 35/00* (2006.01)
(52) U.S. Cl.
CPC ....................................... *G01R 35/00* (2013.01)
USPC ........................................................ 702/106
(58) Field of Classification Search
USPC .............. 702/66, 79, 106, 190, 191, 193–197
See application file for complete search history.

(56) References Cited

U.S. PATENT DOCUMENTS

| | | | |
|---|---|---|---|
| 5,005,146 A | | 4/1991 | Lakatos et al. |
| 5,067,090 A | | 11/1991 | Seeman |
| 5,157,596 A | * | 10/1992 | Alcone ........................... 700/55 |
| 5,684,850 A | | 11/1997 | Warburton et al. |
| 5,774,522 A | | 6/1998 | Warburton |
| 5,821,533 A | | 10/1998 | Bingham et al. |
| 5,870,051 A | | 2/1999 | Warburton et al. |
| 5,872,363 A | | 2/1999 | Bingham et al. |
| 5,873,054 A | * | 2/1999 | Warburton et al. ........... 702/190 |
| 5,884,234 A | | 3/1999 | Jorion et al. |

(Continued)

FOREIGN PATENT DOCUMENTS

DE 197 30 679 A1 1/1998

OTHER PUBLICATIONS

International Search Report for PCT/EP2006/064143 filed Jul. 12, 2006.

*Primary Examiner* — Edward Raymond
(74) *Attorney, Agent, or Firm* — Alston & Bird LLP

(57) ABSTRACT

A method for processing a noisy digital time signal $y_k$ of digital pitch k, corresponding to an initial analogue signal $s_t$ after being conditioned by a conditioning chain. The initial analogue signal $s_t$ includes at least one pulse representing information concerning at least one radiation from a radiation source, the radiation and the pulse having an energy distribution. The method includes the determination of a non-noisy digital estimation signal $s_k$ from the noisy time signal $y_k$ by using a state model representing the conditioning imposed by the conditioning chain and in that the state model includes a Markovian variable $r_k$ to be estimated whereof at least two values are associated with physical characteristics of at least two typical pulses constituting a possible representation, at least approximate, of the pulse in the signal $s_t$.

17 Claims, 5 Drawing Sheets

(56) References Cited

U.S. PATENT DOCUMENTS

| | | |
|---|---|---|
| 5,912,825 A | 6/1999 | Bingham |
| 6,038,526 A * | 3/2000 | Stein .............................. 702/191 |
| 6,295,508 B1 * | 9/2001 | Trammell et al. ............. 702/107 |
| 6,347,288 B1 | 2/2002 | Trammell et al. |
| 6,374,192 B1 | 4/2002 | Brogle et al. |
| 6,522,984 B1 | 2/2003 | Jordanov |
| 6,804,628 B2 * | 10/2004 | Gross et al. ................... 702/183 |
| 2005/0129152 A1 * | 6/2005 | Hillstrom ...................... 375/346 |

\* cited by examiner

FIG. 1 - PRIOR ART
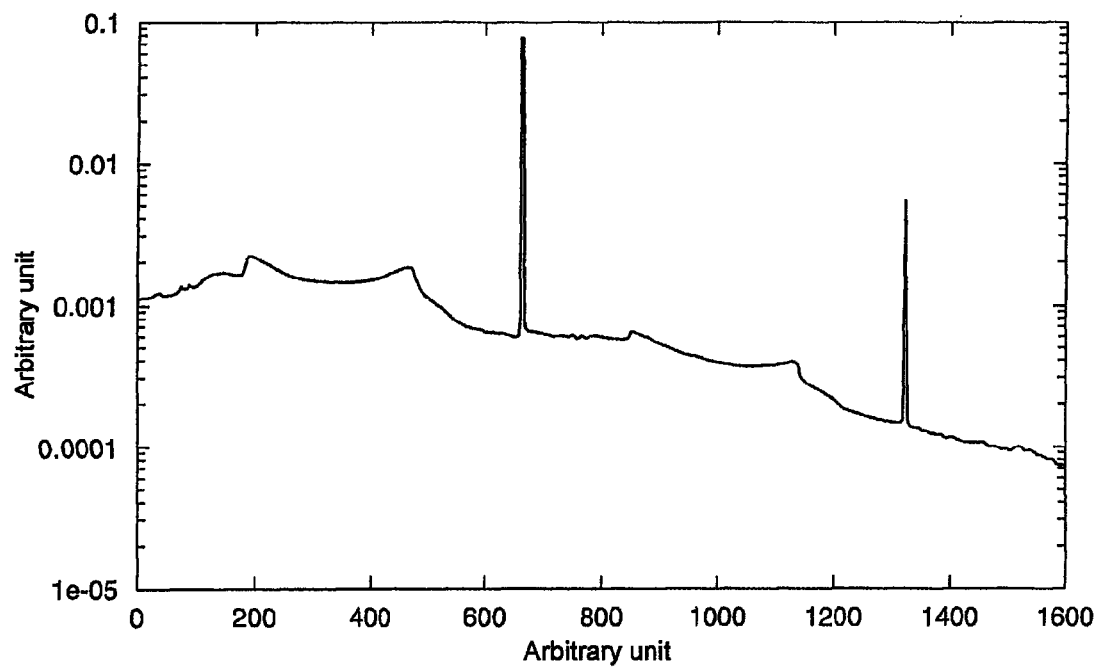
FIG. 2 - PRIOR ART
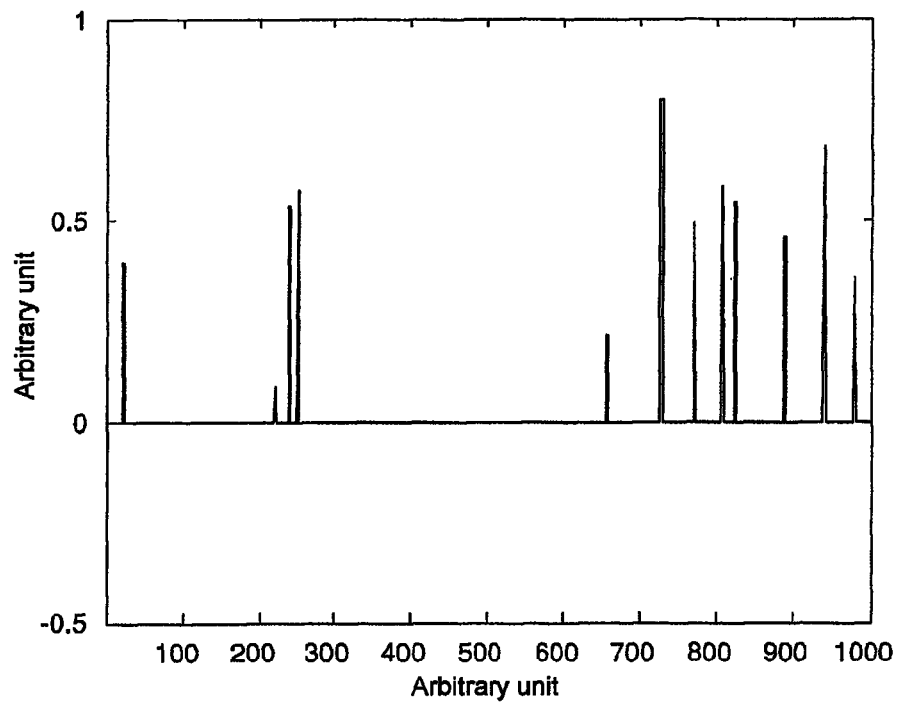

FIG. 3 - PRIOR ART
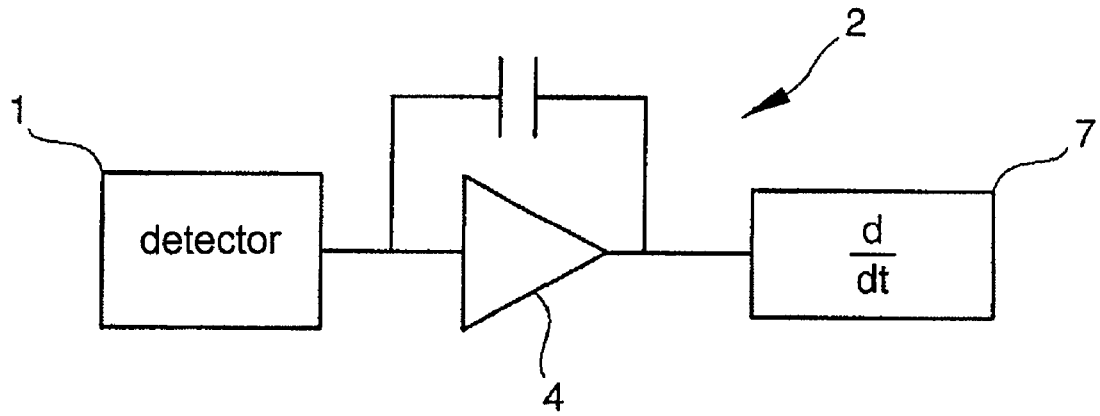
FIG. 4 - PRIOR ART
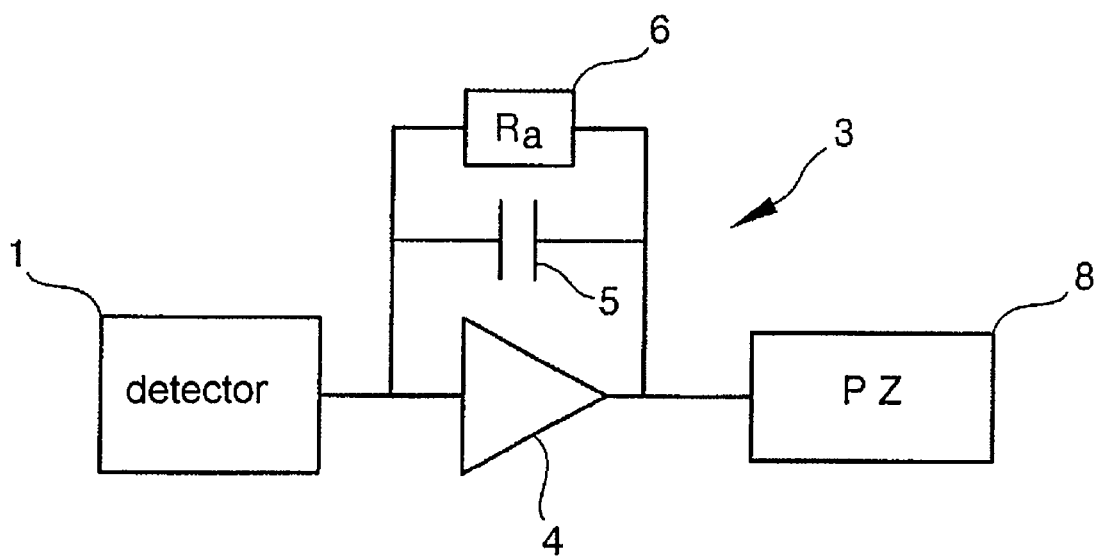

FIG. 5 - PRIOR ART
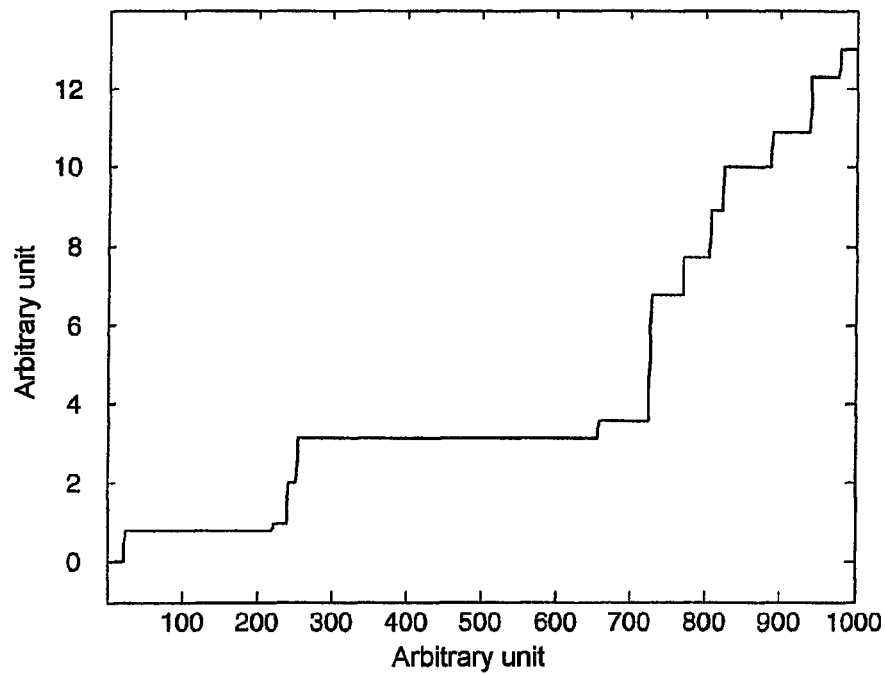
FIG. 6 - PRIOR ART
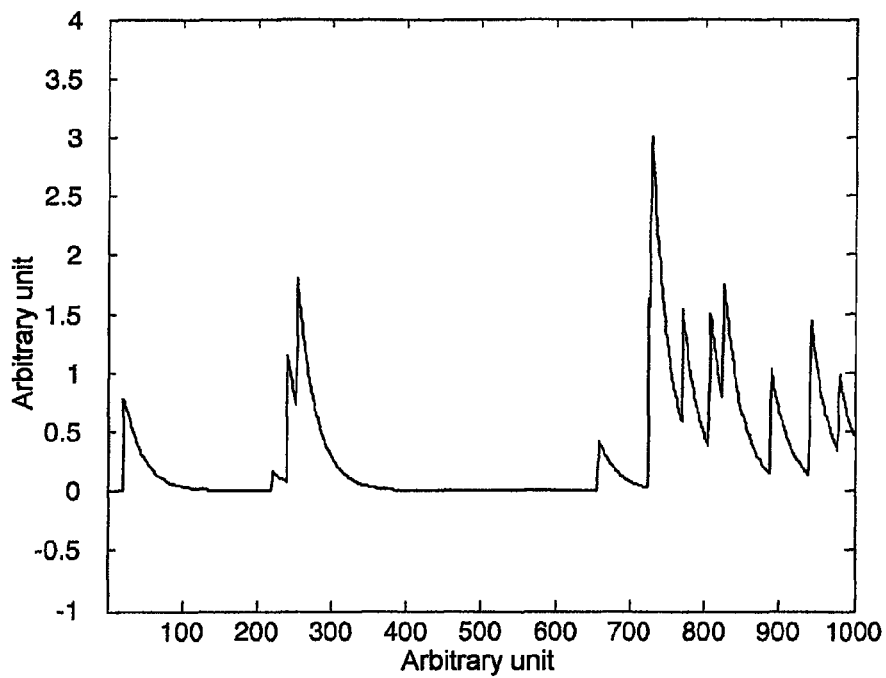

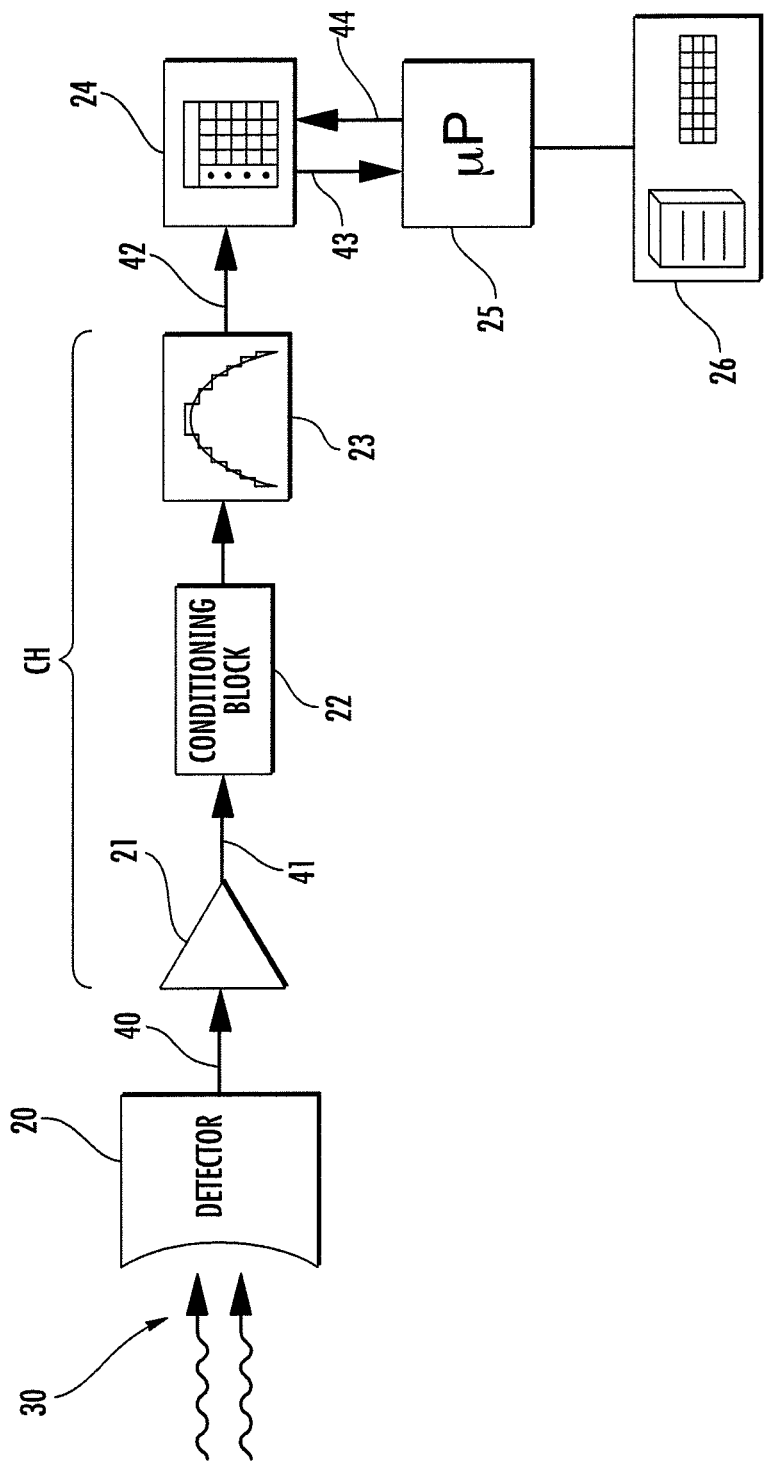

PROCESSING OF A SIGNAL REPRESENTING RADIATION

CROSS REFERENCE TO RELATED APPLICATIONS

This application is a national stage application filed under 35 USC 371 of International Application No. PCT/EP2006/064163, filed Jul. 12, 2006.

FIELD AND BACKGROUND OF THE INVENTION

This present invention concerns a method for the treatment of a noisy temporal digital signal $y_k$ corresponding to an initial analogue signal $s_t$ after it has been conditioned by a conditioning chain, with the said initial analogue signal $s_t$ being representative of information concerning radiation coming from a radiation source, where this radiation can exhibit an energy distribution.

Such a method, or a system designed to implement this method, is generally used in the context of detection, counting and measurement of events, such as detection of the said emitted radiation.

In particular its purpose is the construction of a spectrum that is used for measurement and analysis of the radiation supplied by the source.

It will be observed that, according to the invention, here radiation is considered to be any radiation that is designed to interact with a means of detection so as to be in possession of a usable temporal signal.

In this regard, and by way of non-limiting examples, the radiation covered by the invention in particular concerns photons, especially X and gamma radiation, nuclear particles, or even more generally, any particle or any packet of particles.

Thus a system or method of the type proposed above can in particular have as its purpose the construction of a spectrum that has a number of particles detected at a given energy, as a function of the energy.

This is interesting in particular in the case of particle sources exhibiting an energy distribution.

In fact it is known that a spectrum obtained from such a source can include spectral energy lines that are characteristic to it.

As a consequence, from a measurement of the particle source, it is possible to obtain a spectrum whose examination by a specialist or by software allows one to access information on the said particle source.

In particular, the examination allows one to identify the nature of the source studied.

In the non-limiting example of the gamma-ray field, a system or method of the aforementioned type can supply a spectrum of lines, such as that represented in FIG. 1, which allows us to identify the radio-elements that make up this source, and therefore to characterise the latter.

It will be observed that, by way of an example, FIG. 1 represents a normalised energy spectrum for Caesium 137.

In order to now explain a typical functioning of the systems of the prior art of the aforementioned type, reference will be made to an example in the field of gamma spectrometry.

Nevertheless of course, those skilled in the art will easily be able to extend this example to other categories of radiation, including those mentioned above for example.

FIG. 2 shows a signal that can ideally be observed immediately at the output of a gamma photon detector.

This signal includes a multiplicity of pulses of different amplitude and duration which, for example, represent a current generated by the detector by the passage of a photon in the latter.

It will be observed here that this multiplicity of pulses could also represent a voltage generated by the detector.

In any event, in the remainder of this article, a detector current signal will refer to a signal supplied by the detector.

Returning briefly to the pulses, their width, corresponding to a certain duration in time, is a function of a charge collection time.

As mentioned previously, the detector current signal represented in FIG. 2 is ideal.

As a consequence, such a signal is never observable.

In reality, we generally install a preamplifier at the output of the detector in order to effect a first shaping of the detector current signal.

Generally, two cases of preamplifiers are found in the existing systems, namely capacitive negative-feedback preamplifiers and resistive negative-feedback preamplifiers.

By way of information, FIGS. 3 and 4 illustrate a detector 1 followed respectively by a capacitive negative-feedback preamplifier 2 and a resistive negative-feedback preamplifier 3 which includes a feedback loop between an output and an input of an amplifier 4 composed of a capacitance 5 in parallel with a resistance 6.

These preamplifiers are generally followed by a differentiator circuit 7 in the case of capacitive negative feedback and by a pole-zero correction circuit PZ 8 in the case of resistive negative feedback.

The two FIGS. 5 and 6 respectively show an example of an ideal temporal signal at the output of the aforementioned two types of preamplifier when they are driven at the input by a given detector current signal, on the understanding that noise of an electronic nature is not represented here.

Several stages follow the preamplification stage.

Their order and their implementation can vary significantly.

A known and important stage consists of a shaping of the pulses in order to extract information of the energy type from them.

Such a stage is currently referred to as an "energy shaping" stage.

By way of a non-limiting example, it is possible to extract the information from a measurement of the amplitude or the area of each pulse.

In fact it is assumed that these magnitudes are generally proportional to an energy level.

The choice of the type of "energy shaping" has been the subject of considerable research in recent years in the field of the invention, since this difficult stage necessitates many compromises.

For example, in the case of extracting information from the amplitude of the pulses, a compromise requires that there should exist an optimum between:
  the very precise acquisition of this information, meaning a high resolution,
  the number of pulses per unit of time present in the detector current signal, and
  the fraction of these that one wishes to keep in the spectrum, due for example to a phenomenon that is known in itself and which is normally referred to in this field as the "stacking" of pulses.

For further details on this, the reader can refer in particular to the notions of "output count rate" or OCR, and "input count rate" or ICR.

In order to obtain an optimal solution to this compromise, research ([1], [2]) has established that the use of a filter of trapezoidal shape could constitute an optimum solution in the absence of stacks of pulses and for a certain nature of noise.

Since then, other solutions, still based on the use of this type of filter, have been proposed in order to improve the performance of these systems.

For example, many options for the creation of this type of filter have been proposed [1-8], such as of the digital or analogue or even mixed type, and other methods.

We are also familiar with solutions whose purpose is to improve performance by other means, such as optimisation of the said PZ correction [6,9,10,11], optimisation of a conventional operation that consists of correcting a base line [12], rejection of stacked pulses by correlation between the length and the amplitude of an unstacked pulse [13], and so on.

However, these solutions still involve the use of an optimal trapezoidal filter for the "energy shaping" stage.

Thus, the methods and systems proposed up to the present in any event include a trapezoidal filter and more generally an "energy shaping" stage.

Even though they have rendered great service, the performance of these systems or methods are nevertheless still limited.

In particular, the use of the said trapezoidal filter is still excessively degrading the detector current signal—or at least the preamplified signal—in particular by a temporal lengthening of the pulses.

As a consequence, when the frequency of occurrence of pulses increases (due to an increase in the frequency of the events, such as in the emission of particles), the systems or methods of this type begin to malfunction, ending for example with spectra of low resolution or even misshapen spectra.

This is typically the case toward 100,000 to 200,000 beats per second (counting rate).

And for the systems with highest performance, it is possible to reach 300,000 to 400,000 beats per second.

Another drawback of the aforementioned systems is that their use is still very inflexible.

In particular, it is difficult or even impossible to adapt or modify the parameters of the energy-shaping stage during an analysis of the radiation source.

In an initial phase, it is therefore necessary to ascertain, or at least to estimate as well as possible, the number of pulses per second in order to set up the system in advance, and particularly at the detection level.

Also, if the number of pulses is over-assessed, an excessively short convolution will be chosen, and this will degrade the resolution.

While if this number is under-assessed, an excessively long convolution will be chosen, which will lead to the rejection of many pulses and to distortion of the spectrum.

By way of an example, the systems that, because of their situation, can be set up only when brought into service, are generally set up on a worst case basis.

In particular, setting up on a worst-case basis can consist of setting up the system as a function of the highest measured pulse intensity.

However since this intensity varies over time, the optimal set-up to get the system to work is no longer valid.

Yet another drawback is that the aforementioned systems and methods generally prove to be rather ineffective for detecting pulses of low energy (or amplitude), in particular when they are on the noise limit, or even buried in the latter.

Thus, the performance of these systems and of these methods are very quickly limited when the signal-to-noise (SNR) ratios are low.

SUMMARY OF THE INVENTION

One objective of the invention is therefore to propose an improved method and system that will at least overcome the aforementioned limitations.

In order to attain this objective, the invention proposes a method for the treatment of a noisy temporal digital signal $y_k$ with digital pitch k, corresponding to an initial analogue signal $s_t$ after it has been conditioned by a conditioning chain, where the said initial analogue signal $s_t$ includes at least one pulse that is representative of information concerning at least one radiation pulse coming from a radiation source, where this radiation and this pulse exhibits an energy distribution, characterised in that, from the noisy temporal signal $y_k$, one determines a non-noisy estimated digital signal $s_k$ by means of a state model that is representative of the said conditioning imposed by the conditioning chain, and in that the state model includes a Markov variable $r_k$ to be estimated, of which at least two values are associated with physical characteristics of at least two model pulses, where these models constitute one possible representation, at least a close approach to it, of the pulse in the signal $s_t$.

Preferred but non-limiting aspects of this method are as follows:
- the method also includes a preliminary stage in which one segments the noisy temporal digital signal $y_k$ in into successive sections of N samples;
- one of the values of the Markov variable corresponds to a pulse mode, known as the "noise" mode, for which it is considered that there exists no pulse in the signal with a given pitch k;
- the state model also includes a vector F with constants that depend on the Markov variable and that define, as physical characteristics, an energy range that is linked to the model pulse in question;
- the constants of the vector F are proportional to a maximum predetermined amplitude $A_{min}$ of a model pulse linked to the lowest energy range, where the "noise" mode is not considered here;
- the state model includes a state vector $X_k$ to be estimated, which includes a first component that corresponds to the non-noisy digital estimate $s_k$, that is to the digitised representation of the initial temporal signal $s_t$ at instant t corresponding to the pitch k in question, and the determination, from the noisy temporal signal $y_k$, of the non-noisy estimated digital signal $s_k$, by means of the state model, includes an intermediate stage for the implementation of a Kalman filter for observation of the noisy temporal digital signal $y_k$, with this intermediate stage supplying an intermediate estimate $x_{k/k}$ of the state vector $X_k$ thus including a non-noisy intermediate digital estimate signal $s_{k/k}$, with the latter corresponding to a first determination of the non-noisy estimated digital signal $s_k$ that one is seeking to obtain;
- the determination, from the noisy temporal signal $y_k$, of the non-noisy estimated digital signal $s_k$, by means of the state model, includes a second intermediate stage for implementation of a smoothing algorithm, with this intermediate stage supplying an improved smoothed estimate $X_{k/N}$ of the state vector $X_k$, and therefore an improved smoothed estimate $s_{k/N}$ of the non-noisy estimated digital signal $s_k$ that one is seeking to obtain;

the hidden variable $r_k$ is estimated by means of a Viterbi algorithm;

a criterion is used for optimisation of the Maximum A Posteriori (MAP);

the criterion of the Maximum A Posteriori (MAP) is combined with an Expectation-Maximisation (EM) algorithm;

the criterion of the Maximum A Posteriori, combined with the Expectation-Maximisation (EM) algorithm is employed either:

for estimating the hidden variable $r_k$ for estimating the state vector $X_k$, or for estimating the hidden variable $r_k$ and of the state vector $X_k$;

the state is expressed in the following form:

$$\begin{cases} X_{k+1} = A(r_{k+1})X_k + G(r_{k+1}) + B(r_{k+1})v_{k+1} \\ y_k = CX_k \end{cases}$$

where $$X_k = \begin{pmatrix} s_k \\ b_k \\ n_k \end{pmatrix},$$

in which A is a state matrix, C is an observation matrix, $v_k$ is a Gaussian white-noise vector of unity variance, G is a vector that includes the constants vector F, B is a dynamic noise matrix, $b_k$ is a bias, and $n_k$ is a noise that is intrinsic to a detector of the radiation used in the conditioning chain;

the method includes an initialisation stage in which the dynamic noise matrix B associated with the weakest energy channel is equal to that associated with the next greater energy channel, namely:

$B(r_k=0)=B(r_k=1)$ and in which, for the values of $r_k$ that are equal to or greater than 1, matrix $B(r_k)$ is determined by:

$B(r_k)=F(r_k)-F(r_{k-1})$, where $r_k \geq 1$

Also proposed is a computer program for the treatment of a noisy temporal digital signal $y_k$ with digital pitch k, corresponding to an initial analogue signal $s_t$ after it has been conditioned by a conditioning chain, with the said initial analogue signal $s_t$ including at least one pulse that is representative of information on at least one radiation pulse coming from one radiation source, with this radiation and this pulse exhibiting an energy distribution, characterised in that it includes instructions for implementation of the method according to any of the preceding claims.

Also proposed is a system for the treatment of a noisy temporal digital signal $y_k$ of pitch k, corresponding to an initial analogue signal $s_t$ after it has been conditioned by a conditioning chain, with the said analogue signal $s_t$ including at least one pulse that is representative of information on radiation coming from a radiation source, with this radiation and this pulse exhibiting an energy distribution, characterised in that it includes means that are designed to cooperate with a state model which is representative of the said conditioning impose by the conditioning chain, in order to determine a non-noisy estimated digital signal $s_k$ from the noisy temporal signal $y_k$, and in that the state model includes a Markov variable $r_k$ to be estimated, of which at least two values are used to determine the physical characteristics of at least two model pulses, with these model pulses constituting a possible representation, or at least an approach to it, of the pulse in the signal $s_t$.

Also proposed is a spectrometer and a bolometer, including means that are designed to implement the aforementioned method.

Thus, using the method of the invention, it is possible, with advantage, to get around the shaping stage that has previously limited the methods and systems of the prior art.

In fact this stage is advantageously replaced by the establishment of a state model that includes parameters to be estimated, and that allows us to obtain a faithful digital representation of the current detector both when the energy of the pulses in this signal is much greater than the level of noise, and when it is of the same order as this noise level.

This performance can also be achieved while using counting rates that are very high in relation to the state of the technique.

BRIEF DESCRIPTION OF THE DRAWINGS

Other aspects, aims and advantages of the invention will appear more clearly on reading the description that follows of one embodiment of the invention, which is provided with reference to the appended drawings in which:

FIG. 1, presented earlier in the document, illustrates an energy spectrum for a Caesium 137 source, with the units of the axes being arbitrary, FIG. 2, presented in a example above, illustrates an ideal detector current signal generated by a gamma ray detector, with the units of the axes being arbitrary, FIG. 3 schematically represents a first example of one part of a known conditioning chain including, upstream of a detector, a capacitive negative-feedback preamplifier followed by a differentiator circuit, FIG. 4 schematically represents a second example of one part of a known conditioning chain including, upstream of a detector, a resistive negative-feedback preamplifier followed by a pole-zero correction circuit;

FIG. 5, by way of a non-limiting example, shows a signal obtained from the conditioning chain of the first example, with this chain also including an analogue-digital converter, and with the units of the axes being arbitrary, FIG. 6, by way of a non-limiting example, shows a signal obtained from the chain of the second example, with this chain also including an analogue-digital converter, and with the units of the axes being arbitrary, FIG. 7 schematically shows a complete system used to implement the method of the invention, FIG. 8 schematically shows a method for estimation of the non-noisy digital signal $s_k$, FIG. 9, in the context of one example of an embodiment of the invention, illustrates the use of three different temporal forms to model three typical pulses.

DETAILED DESCRIPTION

Figure 8:
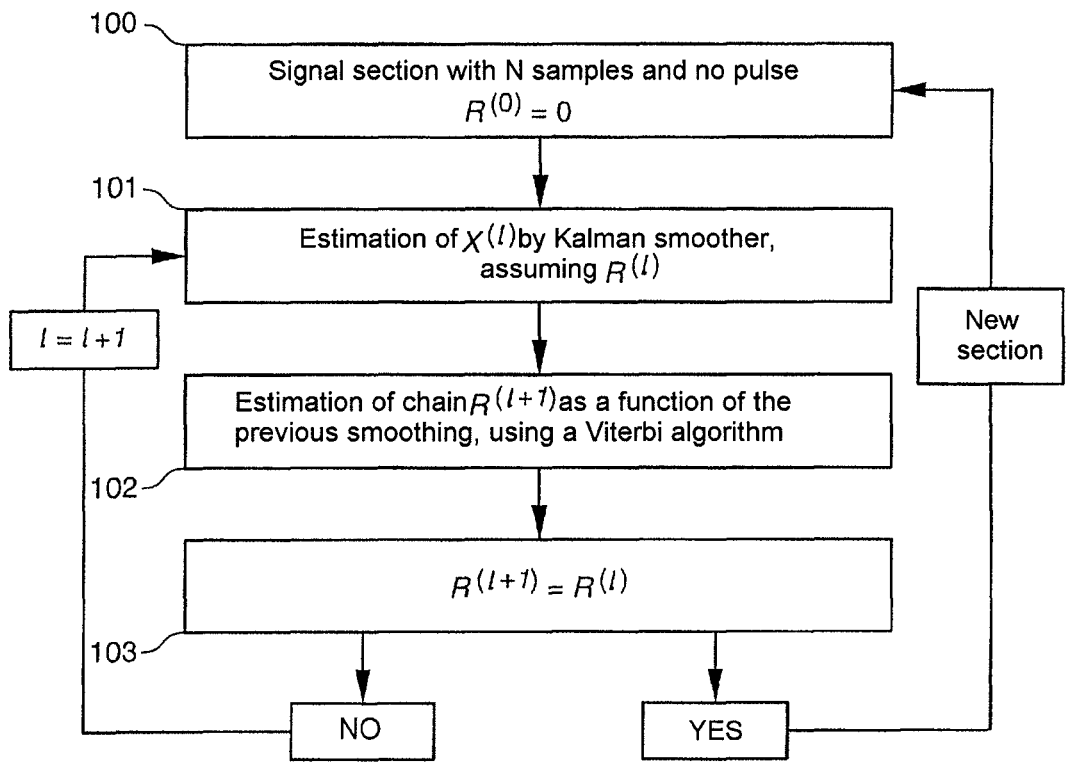

To begin with, FIG. 1 schematically represents one embodiment of the system of the invention.

Such a system essentially includes a detector 20 to detect radiation 30 coming from a radiation source.

This detector is designed to supply a detector current signal 40 that will be conditioned by a conditioning chain CH as represented in FIG. 7.

By way of a non-limiting example, this conditioning chain includes a preamplifier of the aforementioned type, meaning of the type with resistive negative feedback or with capacitive negative-feedback.

In the conditioning chain CH, the preamplified signal 41 thus obtained is then presented to a block 22 that includes a pole-zero correction circuit PZ or a differentiating circuit, according to the choice made regarding the type of the preamplifier 21.

The conditioning chain CH is terminated by an analogue-digital converter 23 at the output of the block 22.

It will be observed here that the conditioning chain CH, as it is presented in the figure, can include many variants that those skilled in the art will envisage naturally.

In particular, there is no obligation to employ such an arrangement of the blocks.

For example, it is possible to envisage that the analogue-digital converter may be positioned further upstream in the system and that the conditioning chain CH is terminated by block 21 (digital preamplification) and then 22.

Moreover, block 22 can implement additional stages for conditioning of the signal.

In this regard, in a detailed example of one embodiment of the invention, we will see that block 22 in particular can include electronic circuits, such as an amplifier and/or an anti-aliasing filter.

Those skilled in the art will therefore easily understand that this simply involves reaching different compromises and choosing a conditioning chain that is best suited to the envisaged application.

At the output of this chain CH, the digitised signal 42 is stored in a dedicated memory 24, and then a computing unit 25, such as a microprocessor or a digital signal processor (DSP) for example, performs calculations from the samples of the stored signal 43.

In particular, it is unit 25 that implements all of the stages used to obtain an estimate of the non-noisy digital signal of the detector current temporal signal 40 (in the remainder of the document, this detector current temporal signal will be indicated by $s_t$) and later by an energy histogram of the radiation source studied.

It will be observed that the signals corresponding in particular to the energy levels of the radiation 44 calculated by unit 25, are stored in memory 24 (they can also be stored in a separate memory).

As can also be seen in FIG. 7, this unit 25 controls peripherals 26 such as a display screen, a keyboard, a mouse, etc.

A description now follows of a preferred embodiment of the method of the invention, corresponding to a treatment of the digitised signal 42 and in particular implementation by the computing unit 25.

As a preliminary, it is specified that the variable k represents a sampling pitch.

In other words, k refers to a sample number, and a correspondence with the notion of "sampling instant" can be effected by using the conventional relation:

$t=k/fe,$ in which t is the sampling instant and fe is the sampling frequency of the converter 23.

It will also be observed that the index k/k of a variable refers to an estimate of this variable obtained from a Kalman filter for example. Index k/N refers to an estimate obtained from a smoothing algorithm, index k+1/k refers to a prediction of the variable indexed as such, and $s_k$ refers to a digital representation that one is seeking to estimate of signal $s_t$.

The computing unit 25 begins with a segmentation of the signal 42 which has been stored beforehand in the memory 24.

Such a segmentation is arranged so as to obtain successive sections of N samples.

By the use of conventional calculations, the computing unit 25 then deduces a noisy temporal digital signal $y_k$ representing a digital version of signal 41, and obtains this from signal 42.

The noisy temporal digital signal $y_k$ is then used for the establishment of a state model, of which one form of development will now be described in the context of a bolometric application that is given by way of a non-limiting example.

As a preliminary, a description will first be given of an important principle on which the state model according to the invention is based.

Using a Markov Chain

We know that when a pulse is generated in the detector current signal because of radiation, it can typically have a short rise time and an exponential decay time.

We also know that these two magnitudes, as well as the amplitude of the pulse, are dependent on the type of radiation.

According to the invention, it is possible to help the representation of these different types of radiation, and the pulse type by analogy, by using a Markov chain in the state model:

$R=\{r_k\}, k=1 \ldots N$ in which N is the number of samples of an aforementioned section and $r_k$ is a Markov variable.

To each value of $r_k$ there corresponds a model pulse, for which, in principle, we specify characteristics that are used to represent it (rise and fall time, amplitude, etc.).

It will henceforth be considered that a value of $r_k$ specifies a pulse mode, meaning predetermined pulse characteristics.

In principle, any pulse present in the detector current signal can always be associated with one of the predetermined pulse modes.

The pulse mode associated with the said pulse is that to which, in a first stage, correspond the characteristics that allow a representation that is closest to the pulse in question.

We then only require that the actual physical characteristics of the pulse in question are exactly those specified in any of the different pulse modes.

It will be observed that, according to the invention, a pulse mode can also determine the characteristics of noise alone.

Such a pulse mode corresponds in particular to the case in which the signal has no pulse at pitch k, but only noise.

In this regard, we will define a first pulse mode $r_k=0$, known as the "noise" mode, for which the detector current signal does not present a pulse with the pitch k concerned (the signal therefore contains only noise).

We will also define a second pulse mode $r_k=1$, for which the signal includes a pulse which exhibits physical characteristics close to a certain amplitude A, with a rise time $t_1$, etc.

Although these two pulse modes would suffice, it is possible to define others of course.

An equation of the non-noisy estimated signal $s_k$ of the detector current signal can be expressed in a simplified manner in the following form:

$$s_k=\alpha(r_k)s_{k-1}+F(r_k) \quad (1)$$

in which $\alpha(r_k)$ is a vector that includes constants representing the rise and fall times.

In the bolometry example, it is possible to set the values of $\alpha(r_k)$ from thermodynamic magnitudes, such as a calorific capacity of the detector and a thermal conductivity between an absorber and a sensor of this detector.

Typically, for the "noise" mode ($r_k$=0), it is possible to specify:

$$\alpha(r_k=0)=\exp(-1/\tau d)$$

where $$\tau d=C/G,$$

and for the other modes, $$\alpha(r_k=1)=\exp(-1/\rho d1)$$

where, $$\tau d1=C1/G1, \text{etc.}\ldots$$

Thus, the value of the Markov variable that corresponds to a given pulse mode, here determines the value of the time constant to be used to help with the estimate of the pulse during analysis at pitch k.

As can be seen, F is also a vector which is a function of the Markov variable $r_k$.

More precisely, here F represents a rising pitch of the pulse at pitch k.

In particular, if the pulse presents a rising edge of straight-line shape, then F represents the slope of the latter.

Thus, to a zero value of F there corresponds a zero slope, or at least substantially zero, thus indicating the absence of a pulse.

The shape of the signal is therefore supposed not to vary (or to vary very little) if, at the previous pitch, it already consisted only of noise, or indeed the signal is supposed to return to equilibrium in the form of a decaying exponential if it consisted of a pulse at the previous pitch.

As can be seen, such an event typically corresponds to the aforementioned "noise" mode.

Equation (1) can thenceforth be expressed in the following form:

$$s_k=\alpha(r_k=0)\,s_{k-1}+F(r_k=0),$$

giving, $$s_k=\alpha(r_k=0)s_{k-1}$$

In the example considered here by way of a non-limiting example, it can be seen that the Markov variable $r_k$ allows a selection, on the characteristics of rise time, decay time, and amplitude, of a given pulse in order to assist with the estimate of its representation $s_k$.

Making the value F dependent upon the random variable $r_k$ enables us to allow for any type of energy for a pulse, through the notion of amplitude, including those on the noise limit.

In addition, we improve the estimation of this energy because of a very refined state model for different possible energy ranges (or by analogy, for different amplitude ranges).

In addition, making the value a dependent upon the random chain $r_k$ enables us to allow for different signal shapes.

It is thus possible to classify pulses coming out of events of different nature.

Proposal of a State Model that Includes a Markov Chain

Having previously presented the advantages associated with the principle of using a Markov variable to model the detector current signal that includes pulses to be estimated, we will now describe a preferred embodiment of the invention implementing such a principle.

A state model proposed by the invention is given below in the form of an equation:

$$\begin{cases} X_{k+1} = A(r_{k+1})X_k + G(r_{k+1}) + B(r_{k+1})v_{k+1} \\ y_k = CX_k \end{cases}$$

where:

$$X_k = \begin{pmatrix} s_k \\ b_k \\ n_k \end{pmatrix}$$

in which A is a state matrix that includes $\alpha$ and other coefficients in particular modelling the noise and the transfer function of the preamplifier, C is an observation matrix, $v_k$ is a Gaussian white noise of unity variance, G is a vector that includes the vector F, B a dynamic noise matrix, $X_k$ is a state vector that includes the non-noisy digital signal $s_k$ to be estimated, $b_k$ is a bias, $n_k$ is a noise that is intrinsic to the detector, and $y_k$ is the noisy digital signal used here as observation of the state model.

The A matrix combined with the Markov variable $r_k$ in particular allows account to be taken of a temporal form of the pulses in accordance with a given pulse mode (exponential, etc.\ldots).

F and B combined with the said variable $r_k$ allows account to be taken of a pulse energy range according to the pulse mode concerned (energy or amplitude by equivalence)

The number of energy ranges depends in particular on the number of pulse modes chosen, meaning the number of pre-determined values than can be taken by the Markov variable.

This number will be chosen according to the case in point.

In general, it will be seen that the more this number increases the more precise the modelling becomes.

In particular, a performance improvement obtained with this model is important in particular when the signal includes pulses whose energy is located on the noise limit (in other words for a low signal-to-noise ratio) and that it therefore becomes difficult to detect.

In this regard, it will be possible to arrange on the one hand that a larger number of pulse modes are defined for the low-energy pulses.

On the other hand, it will be seen that as the number of pulse modes increases, and as the dimension of the state model increases, this that can slow down the calculation rate.
Estimating the Variables of the State Model In order to estimate the state variables of the state model, in particular including the Markov variable $r_k$ and the vector $X_k$, use is made of an estimating algorithm.

According to a preferred aspect of the invention, this algorithm is optimised according to a criterion of the Maximum A Posteriori (MAP).

One advantage of such a criterion is that it takes account of the observations $y_k$.

It will also be noted that another advantage of this criterion is that it allows us to use an a priori on the variable to be estimated.

It therefore allows a very good optimisation of the parameters of the state model.

According to the invention, it s proposed to apply the said aforementioned MAP criterion in accordance with three options.

It is proposed that it be applied to the Markov chain R only, to the state vector $X_k$ only, or indeed to the state vector $X_k$ and to the Markov chain R jointly.

In other words, the following is proposed in a generalised mathematical form:

$$\begin{cases} \hat{R}^{MAP} = \arg\max_R f(R/Y) \text{ where } R = \{r_1, \ldots, r_N\} \text{ et } Y = \{y_1, \ldots, y_N\} \\ \text{or } \hat{X}^{MAP} = \arg\max_X f(X/Y) \text{ where } X = \{X_1, \ldots, X_N\} \\ \text{or } (\hat{R}, \hat{X}^{MAP}) = \arg\max_{(R,X)} f(X, R/Y) \end{cases}$$

in which f(φ|Y) refers to an a posteriori probability density of φ, meaning a probability of having φ, in the light of the observation Y, and given that φ corresponds, as desired, to R, X or the two jointly.

Other optimisation criteria, such as the Maximum Probability criterion, can be used instead of the MAP criterion or in combination with the latter.

In order to optimise f(φ|Y), we use a deterministic method which in particular offers the advantage of being in terms of implementation time in relation to a conventional method such as Monte Carlo by Markov chain (MCMC).

To this end, use is made of an Expectation-Maximisation (EM) algorithm. The reader is invited to refer to the very many publications concerning this known algorithmic technique.

It will be observed here that such an algorithm itself also advantageously allows us to use a notion of à priori on the Markov chain, in the form of a probability of transition from instant k−1 to k.

Thus, by means of this probability, it is to some extent possible to have an à priori on a duration of the different modes in which the state system is situated.

It is possible, for example, to have an à priori for an average duration during which there will be no detection (mode $r_k=0$).

It is also possible to have an à priori over a period of the rise of a pulse.

FIG. 8 shows the diagram of one embodiment of the method of the invention as applied to the case φ=R.

Those skilled in the art will easily adapt this diagram to the two other cases proposed earlier, namely the cases in which φ=R and φ=(R,X).

As can be seen in the said figure, the method is iterative, and is based firstly on an estimate of the Markov chain R and secondly on the state vector $X_k$.

A first initialisation stage 100 is executed.

This corresponds to a zero value of incrementation pitch ℓ of a loop that will be described later.

In this initialisation phase, on the basis of a section of N samples, we start with the assumption that there is no pulse in the detector current signal, and therefore in the non-noisy estimated signal $s_k$.

As a consequence, the Markov chain R is zero at the start over the whole signal section, so we are in the "noise" mode at each pitch k.

Other parameters of the state model are set up at initialisation.

We will deal with this in greater detail in a later part of the description.

For the moment, it will be seen that once this initialisation phase has ended, the estimation method is designed to implement the following stages without the need to perform any new adjustments.

One of these following stages is indicated by the reference 101.

This constitutes the start of the iterative loop on index ℓ.

In this stage 101, we effect an estimate of the state vector $X_k$ at iteration ℓ, in the light of the Markov chain R at this iteration.

The estimate is implemented by means of a Kalman filter, and then by means of a smoothing algorithm, the whole being applied to the same section N.

Stage 101 is followed by a stage 102 in which we estimate the Markov chain for the next iteration (ℓ.+1) as a function of the result obtained for the state vector $X_k$ at iteration ℓ..

To this end, we advantageously propose the use of a Viterbi algorithm.

We will now describe, in greater detail, a way of implementing stages 101 and 102, in an example that is given by way of illustration.

In a stage 103 that follows stage 102, a test is performed in order to determine if the Markov chains at iterations ℓ. and ℓ.+1 are identical.

If the test is negative, the pitch ℓ. of the loop is incremented and the method re-starts at stage 101.

Conversely, if the chains are identical, it is considered that all of the state variables are optimised in the section N concerned, and that therefore the non-noisy estimated signal $s_k$ is a satisfactory representation of the detector current signal over the said section.

The method is then applied to a new section N, typically the next section N, and re-starts at stage 100.

Initialisation Phase a—Bias $b_k$

In addition to the operations mentioned, stage 100 in FIG. 8 can include an estimate of bias $b_k$ (it is recalled that $b_k$ is built into the state vector $X_k$).

This bias corresponds to a baseline level of noisy the digital signal $y_k$.

Such an estimate of the bias means that the Kalman filter at stage 101 starts in optimised conditions.

To this end, the bias $b_k$ is determine from the following equation:

$$b_k = b_{k-1} + \sigma_b u_k \qquad (2)$$

in which $u_k$ is a Gaussian white noise of unity variance and $\sigma_b$ is the associated standard deviation.

This standard deviation $\sigma_b$ is determined by taking the method of a histogram of the values taken by the K first samples of the data item corresponding to the noisy digital signal $y_k$.

b—Choice of the Energy Ranges for F

To begin with, we consider the pulse mode corresponding to the lowest energy range, excluding the "noise" mode.

This pulse mode corresponds to $r_k=1$ and is called the least energetic.

For this mode, on determine a maximum value of the energy of the pulse to be detected.

We then deduce a maximum value $F_{max}$ to be used in the state model.

Let us assume that we are seeking to estimate pulses on the noise limit, such as pulses of amplitude $A_{min}$ of the order of $3\sigma_n$, where $\sigma_n$ is the standard deviation of the noise $n_k$ (amplitude $A_{min}$ corresponds to the maximum amplitude at the end of the pulse, meaning the amplitude at the last pitch k of the pulse in question).

We calculate a value F1 of F (F1 is associated with mode $r_k=1$) dividing the said amplitude $A_{min}$ by the mean pitch number k occupied by the pulse, in particular by its rise time.

It will be observed that the pitch number k can be obtained by the ratio $T_1/T_e$, if $T_1$ is the duration of the mode $r_k=1$, and Te the sampling pitch.

As a consequence:

$$F_1 = \frac{T_e}{T_1} A_{min}$$

We thus obtain a characteristic of the least energetic pulse mode, i.e. mode n=1.

A substantially similar procedure is employed to establish the characteristics of the other pulse modes.

We therefore establish all of the parameters $F_k$ of vector F, in the light of the mode $r_k$ concerned.

According to one aspect of the invention, we will arrange that these other values of F are spaced out regularly.

According to another aspect, we will arrange on the other hand that these values are increasingly spaced out, in particular when it is desired to have greater precision at low energies (or low amplitudes).

By way of an example, it is possible to set:
$F_2=2F_1$, $F_3=4F_1$, $F_4=8F_1$, $F_5=16F_1$, etc., up to $F_{Nm}$ in which Nm is the number of pulse modes.

c—Noise Parameters

The noise taken into account in the state model has different origins.

It can be a noise associated with the aforementioned bias, a noise associated with a pulse, or indeed a noise that is intrinsic to the detector, namely a noise denoted $n_k$, which exists despite the absence of a pulse.

Noise $n_k$

Concerning the noise that is intrinsic to the detector $n_k$, this is estimated on data ranges of the noisy digital signal $y_k$ that have no pulse.

In order to be able to incorporate this noise into the state model, it is possible to use an AutoRegressive—Moving Average (ARMA) model.

This is, $$n_k = \sum_{l=1}^{p} a_l n_{k-l} + \sum_{m=0}^{q} b_m \varepsilon_{m-k} \quad (3)$$

in which p is the order of the auto-regressive part (AR) of the model, q is the mobile medium part (MA), and $\varepsilon_k$ is white-noise.

In order to determine the coefficients $a_1$, $b_m$ and the standard deviation of $\varepsilon_k$, it is possible to use an Innovations algorithm in a known manner.

For example, if the noise $n_k$ is determined by a model AR(1), we get:

$$n_k = a^{\ell.=0} n_{k-}{}^{\ell.} + \varepsilon_k$$

Regarding the noise associated with a pulse, we have seen that according to the preferred mode of the invention, it is rendered dependent on the Markov variable $r_k$ by means of matrix B.

Noise Associated with a Pulse: Dynamic Matrix B

The values of B are determined as a function of predefined values of the vector $F(r_k)$.

A high degree of precision in the values of F is not necessary.

We must nevertheless make sure that the distributions between two successive pulse modes have an adequate intersection zone.

To this end, regarding the pulse modes other than the "noise" mode, it is possible, for example, to determine B in the following way:

$$B(r_k) = F(r_k) - F(r_{k-1}) \text{ for } r_k \geq 1$$

Regarding the "noise" mode specifically, we could set:

$$B(r_k=0)=0$$

But the applicant has observed that B should preferably include small non-zero values.

For example, $$B(r_k=0)=\varepsilon=1e-6$$

In particular, this enables us to avoid calculation singularity problems in the equations while still having little influence on the content of the state model.

Of course other values can be chosen for $\varepsilon$.

The applicant has also observed that, during the initialisation phase, fixing B to $\varepsilon$ could lead to the absence of an update to the Markov chain during iterations 1 strictly above 0 (1>0).

Thus it is propose that during stage 100, for which rk=0, $B(r_k)$ is different from $\varepsilon$.

According to a preferred aspect of the invention, it is propose that, in the initialisation phase 100, B should be determined by the following equation:

$$B^{(\ell.=0)}(r_k=0)=B(r_k=1)=B_1$$

and in the next iteration by:

$$B^{(\ell.>0)}(r_k=0)=\varepsilon$$

d—Choice of the Temporal Forms of the Pulses According to the Pulse Mode

An analysis on detector current signals with an adequate signal-to-noise ratio allows us to model their shape.

This modelling can be implemented by means of a decreasing exponential sum.

For example, it is possible to use the following equation:

$$s_t = \sum_i \alpha_i \exp(-\beta_i t)$$

in which St is the analogue signal.

The pulses observed in these signals can be adjusted to an exponential sum using a Nelder-Mead algorithm.

In this way, we simplify later passage to a recursive write.

In this type of recursive write, a simple exponential can in particular be written in the following form:

$$x_k = \alpha x_{k-1}$$

A rise of the signal corresponding to a pulse can also be written using an exponential:

$$x_k = \alpha x_{k-1} + F$$

A Priori on the Markov Chain

We need to estimate the transition probabilities from one type of pulse to another, or of noise to a pulse $Pr(r_k|r_{k-1}) = P_{k-1,k}$.

To this end, it is assumed that we can make an assumption regarding the duration of the different pulse modes.

If we assume in particular that a pulse corresponding to the $k^{th}$ mode lasts for $T_k$, and that the sampling pitch is $T_e$, then the probability of remaining in a given mode can be estimated by:

$$Pr(r_k | r_{k-1} = r_k) = \exp\left(-\frac{T_e}{T_k} \log(2)\right)$$

This means that there exists one chance in two that this mode will last for $T_k$.

Greater precision has not appeared to be necessary.

The other transition probabilities are calculated from an estimate of the activity of the source studied.

Detailed Example of One Embodiment of the Invention

We will now present a detailed example of one embodiment of the invention.

Temporal Form

As a preliminary, it is assumed that we are considering two possible temporal pulse shapes.

Figure 9:
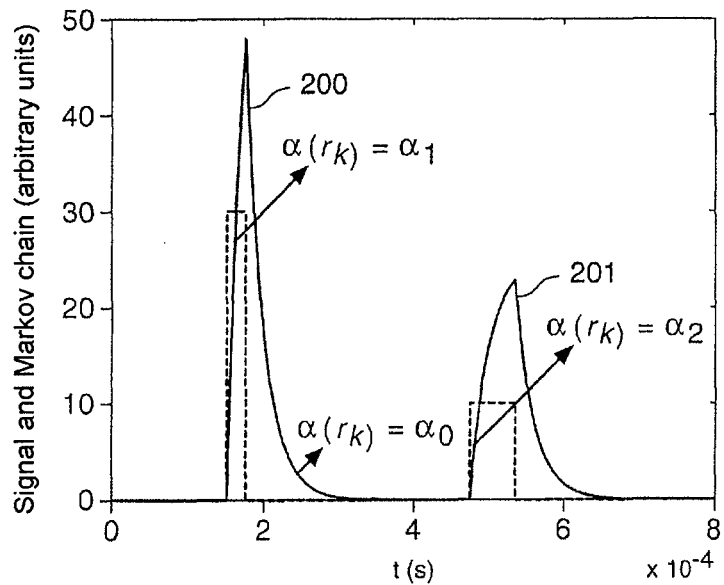

By way of illustration, these are represented by pulse models 200 and 201 in FIG. 9.

Each model pulse is associated with an exponential with the time constants $\alpha_1$ and $\alpha_2$ respectively, where this exponential is used to model their shape.

The "noise" mode corresponding, amongst other things, to a return to equilibrium of a pulse, is the same whatever the type of pulse.

A constant, $\alpha_0$, is associated with this "noise" mode.

Energetic Range

It is also assumed that one is seeking pulses in an energy range $[F_1, F_{N_f}]$, where $N_f$ is the number of energy ranges.

We therefore have a "noise" mode, and $2N_f$ different pulse modes, so that $N_m = 2N_f + 1$ with $N_m$ being the total number of pulse modes (the $2N_f$ modes come from the fact that we have two models of different temporal shape and $N_f$ energy ranges)

It is again assumed that we choose energy ranges of equal width and spaced out regularly, namely:

$$F(r_k) = \beta F_1 \text{ and } B(r_k) = F_1$$

in which $\beta$ is a constant.

We are now able to write a digital representation $s_k$ of the detector current signal:

$$x_k = \alpha(r_k) x_{k-1} + F(r_k) + B(r_k) w_k$$

In the knowledge that for each pulse mode defined by the value of $r_k$, we have chosen a time-constant pair (for the temporal form of the pulse)/energetic range.

In this case:
if $r_k=0$, then $a(r_k)=\alpha_0$, $F(r_k)=0$ and $B(r_k)=1e-6$ ("noise" mode)
if $r_k=1$, then $\alpha(r_k)=\alpha_1$, $F(r_k)=F_1$, and $B(r_k)=F_1$
if $r_k=2$, then $\alpha(r_k)=\alpha_2$, $F(r_k)=F_1$, and $B(r_k)=F_1$
if $r_k=3$, then $\alpha(r_k)=\alpha_1$, $F(r_k)=F_2=2F_1$ and $B(r_k)=F_1$
if $r_k=4$, then $\alpha(r_k)=\alpha_2$, $F(r_k)=F_2=2F_1$ and $B(r_k)=F_1$,
if $r_k=N_m-1$, then $\alpha(r_k)=\alpha_1$, $F(r_k)=N_f F_1$ and $B(r_k)=F_1$
if $r_k=N_m$, then $\alpha(r_k)=\alpha_2$, $F(r_k)=N_f F_1$ and $B(r_k)=F_1$ Again taking up the notations of the previous sections, the state model is finally written as:

$$X_k = \begin{pmatrix} x_k \\ b_k \\ n_k \end{pmatrix}$$

$$= \underbrace{\begin{pmatrix} \alpha(r_k) & 0 & 0 \\ 0 & 1 & 0 \\ 0 & 0 & a_1 \end{pmatrix}}_{A(r_k)} \underbrace{\begin{pmatrix} x_{k-1} \\ b_{k-1} \\ n_{k-1} \end{pmatrix}}_{X_{k-1}} + \underbrace{\begin{pmatrix} F(r_k) \\ 0 \\ 0 \end{pmatrix}}_{G(r_k)} + \begin{pmatrix} B(r_k) w_k \\ \sigma_b u_k \\ \varepsilon \end{pmatrix}$$

$$y_k = \underbrace{[1 \quad 1 \quad 1]}_{C} X_k$$

As proposed previously, the noise $n_k$ is modelled by a model AR(1).

In order to obtain an estimate on $X_k$ of order 2 that is useful for the estimating stage of the Markov chain, we increase the state system.

To this end, the state model defined previously is transformed in the following way:

$$\begin{cases} \xi_{k+1} = A^*(r_k^{(l)}) \xi_k + G^*(r_{k+1}^{(l)}) + B^*(r_{k+1}^{(l)}) v_{k+1}^* \\ y_k = C^* \xi_k \end{cases}$$

where, $$\xi_k = \begin{pmatrix} X_k \\ X_{k-1} \end{pmatrix}$$

$$A^*(r_k^{(l)}) = \begin{pmatrix} A(r_k^{(l)}) & 0_{n_x \times n_x} \\ Id_{n_x \times n_x} & 0_{n_x \times n_x} \end{pmatrix}$$

$$G^*(r_k^{(l)}) = \begin{pmatrix} G(r_k^{(l)}) \\ 0_{n_x \times 1} \end{pmatrix}$$

$$B^*(r_k^{(l)}) = \begin{pmatrix} B(r_k^{(l)}) & 0_{n_x \times n_x} \\ 0_{n_x \times n_x} & 0_{n_x \times n_x} \end{pmatrix}$$

$$v_k^* = \begin{pmatrix} v_k \\ v_{k-1} \end{pmatrix}$$

$$C^* = (C \quad 0_{1 \times n_x})$$

in the knowledge that $n_x$, is the dimension of the state vector concerned, $0_{m \times n}$ and $Id_{m \times n}$ are null matrices and $m \times n$ size identity matrices, respectively. Finally we apply the following two stages:

In order to estimate the state variables, including variable X, we employ the method described in FIG. 9, with the MAP-EM criterion being applied to the chain R in this example.

Those skilled in the art will easily adapt the method to the two other cases for which the criterion is applied to X or (X, R).

Kalman Filter: Stage 101

A conventional Kalman filter algorithm is used.

For example, filtering includes the following stages executed in a loop of index k, k, varying from 1 to N:

$$\xi_{k|k-1} = A^*(r_k^{(l)}) \epsilon_{k-1|k-1} + G^*(r_k^{(l)})$$

$$P_{k|k-1} = A^*(r_k^{(l)}) P_{k-1|k-1} A^T(r_k^{(l)}) + B^*(r_k^{(l)}) B^T(r_k^{(l)})$$

$$\epsilon_k = y_k - C^* \xi_{k|k-1}$$

$$S_k = C^* P_{k|k-1} C^{*T}$$

$$K_k = P_{k|k-1} C^{*T} S_k^{-1}$$

$$\xi_{k|k} = \xi_{k|k-1} + K_k \epsilon_k$$

$$P_{k|k} = P_{k|k-1} - P_{k|k-} C^{*T} \times S_k^{-1} C^* P_{k|k-1}$$

where $\epsilon k$ is an innovation, $s_k$ is a variance of innovation $\epsilon k$, $\epsilon k$ is a Kalman gain, $P_{k/k}$ is a covariance matrix of the estimate error, $P_{k/k-1}$ is a covariance matrix of the prediction error.

It will be observed in this example that the Markov chain involves only the first two equations.

Smoothing: Stage 101

This also uses a conventional algorithm.

It includes the following stages for example effected in a loop of index k, where k varies from N−1 to 1.

$$A_k = A(r_k^{(l)}) - K_k C^*$$

$$\lambda_{k/N} = A^*_k(r_k^{(l)})\lambda_{k+1/N} + C^* S_k^{-1} \epsilon_k \text{ where } \lambda_{N/N} = 0_{n_x \times 1}$$

$$\Lambda_{k/N} = A^*_k(r_k^{(l)})\Lambda_{k+1/N} A_k(r_k^{(l)}) + C^{*T} S_k^{-1} C \text{ avec}$$
$$\Lambda_{N/N} = 0_{n_x \times n_x}$$

$$X_{k/N} = X_{k/k-1} + P_{k/k-1}\lambda_{k/N}$$

$$P_{k/N} = P_{k/k-1} - P_{k/k-1}\lambda_{k/N} P_{k/k-1}$$

We therefore get an estimate of the state vector $X_k$ and thus of the non-noisy estimated signal $s_k$.

The following stage 102 then consists of estimating the Markov chain R.

In this example, we use a Viterbi algorithm.

The latter uses the log-probability denoted here as $br_k (y_k, R^{(l)})$.

This magnitude is linked to the probability of finding oneself in mode $r_k$ in the light of observation $y_k$.

In this example, it is expressed as follows:

$$b_{r_k}(y_k, R^{(1)}) = -\frac{1}{2}\left[\frac{1}{D^2}\left(y_k(y_k - 2C\overline{X_k}^{(1)}) + \text{Trace}\left[\overline{CX_k X_k^T}^{(1)} C^T\right]\right)\right] -$$
$$\frac{1}{2}\log(|B(r_k)B(r_k)^T|) -$$
$$\frac{1}{2}\left\{[B(r_k)B(r_k)^T]^{-1} \times \left[\overline{X_k X_k^T}^{(1)} \times \overline{X_k X_{k-1}^T}^{(1)} A^T(r_k) - A(r_k)\overline{X_{k-1} X_k^T}^{(1)} +\right.\right.$$
$$A(r_k)\overline{X_{k-1} X_{k-1}^T}^{(1)} A(r_k)^T - G(r_k)(\overline{X_k}^{(1)} - A\overline{X_{k-1}}^{(1)})^T -$$
$$\left.\left.(\overline{X_k}^{(1)} - A\overline{X_{k-1}}^{(1)})^T G(r_k)^T + G(r_k)G(r_k)^T\right]\right\}$$

The magnitudes, including the state vector $X_k$, are determined using the Kalman smoother described earlier.

The structure of the Viterbi algorithm used is the same as that traditionally described in the literature.

But those skilled in the art will observer that the expression of the log probability is particular here.

The invention is in no way limited to the form of implementation presented in this description, and the appended drawings.

In particular, it is possible to transform the method of the invention in a simple manner by applying the MAP criterion, not on the Markov chain R as has been described, but on the state vector $X_k$ or on $X_k$ and R jointly.

In this regard, if the MAP optimality criterion is applied to X, it will be possible to carry out the following adaptations by referring jointly to FIG. 8:

stage 100 for initialisation of $X^{(0)}$;
calculation of conditional probabilities using an estimator of the Markov chain;
calculation of $X^{(\ell.+1)}$ by a Kalman smoother, using the previously estimated probabilities;
stop when the Euclidian distance between $X^{(\ell.)}$ and $X^{(\ell.+1)}$ is sufficiently low.

And if the MAP optimality criterion is applied to X and to R jointly, then:

initialisation phase of $X^{(0)}$ and of $R^{(0)}$;
calculation of $X^{(\ell.+1)}$ by a Kalman smoother (of the same structure as in the algorithm described in this document);
calculation of $R^{(\ell.+1)}$ by a Viterbi algorithm;
stop when $R^{(\ell.)} = R^{(\ell.+1)}$.

Note that this last algorithm is of a structure that is similar to that presented in FIG. 8.

It differs however, in particular in the phase for estimation of the chain, in which the log-probability is calculated differently.

BIBLIOGRAPHICAL REFERENCES

[1] U.S. Pat. No. 5,005,146 April 1991 Signal processing method for nuclear spectrometers.
[2] U.S. Pat. No. 5,067,090 November 1991 Nuclear spectroscopy method and apparatus for digital pulse height analysis.
[3] U.S. Pat. No. 5,684,850 November 1997 Method and apparatus for digitally based high.
[4] U.S. Pat. No. 5,774,522 June 1998 Method and apparatus for digitally based high speed x-ray spectrometer for direct coupled use with continuous discharge preamplifiers.
[5] U.S. Pat. No. 5,821,533 October 1998 Automatic pulse top optimisation circuit for an ionising radiation spectroscopy system.
[6] U.S. Pat. No. 5,872,363 February 1999 Automatic pole-zero adjustment circuit for an ionising radiation spectroscopy system.
[7] U.S. Pat. No. 5,873,054 February 1999 Method and apparatus for combinatorial logic signal processor in a digitally based high speed x-ray spectrometer.
[8] U.S. Pat. No. 5,870,051 February 1999 Method and apparatus for analogue signal conditioner for high speed, digital x-ray spectrometer.
[9] U.S. Pat. No. 6,295,508 September 2001 Automatic pole-zero adjustment circuit for an ionising radiation spectroscopy system and method.
[10] U.S. Pat. No. 6,347,288 February 2002 Automatic pole-zero adjustment circuit for an ionising radiation spectroscopy system and method.
[11] U.S. Pat. No. 6,374,192 April 2002 Apparatus and method for automatic correction of pole-zero error in a spectroscopy system.
[12] U.S. Pat. No. 6,522,984 February 2003 Instant pole-zero corrector for digital radiation spectrometers and the same with automatic attenuator calibration
[13] U.S. Pat. No. 5,912,825 June 1999 Gated base line restorer
[14] U.S. Pat. No. 5,884,234 March 1999 Method for pulse shape regulation and discrimination in a nuclear spectroscopy system.

The invention claimed is:

1. A method for treatment of a noisy temporal digital signal $(y_k)$ with digital pitch (k), said noisy temporal digital signal $(y_k)$ corresponding to an initial analogue signal $(s_t)$ after it has been conditioned by a conditioning chain, with said initial analogue signal $(s_t)$ including at least one pulse representative of information on radiation (30) coming from a radiation source, with this radiation (30) and the at least one pulse exhibiting an energy distribution, wherein a non-noisy estimated digital signal $(s_k)$ is determined, by a computing unit, from the noisy temporal digital signal $(y_k)$ by using a state model representative of said conditioning imposed by the conditioning chain, and wherein the state model includes a Markov variable $(r_k)$ to be estimated, said Markov variable $(r_k)$ being able to take at least two values, each of the at least two Markov variable $(r_k)$ values being associated with physical characteristics of a corresponding model pulses, with each corresponding model pulse constituting a possible representation, or at least closely approaching a possible representation, of the at least one pulse in the initial analogue signal $(S_t)$.

2. A treatment method according to claim 1, wherein the treatment method also includes a preliminary stage in which the noisy temporal digital signal ($y_k$) is segmented into successive sections of N samples.

3. A treatment method according claim 1, wherein a given one of the at least two Markov variable values corresponds to a pulse mode, known as the "noise" mode, for which it is considered that there exists no pulse in the noisy temporal digital signal ($y_k$) at a given digital pitch (k).

4. A treatment method according to claim 3, wherein the state model also includes a vector (F) with constants, each one of the constants of the vector (F)-being associated with one of the at least two Markov variable ($r_k$) values, and each one of said constants of the vector (F) defining, as physical characteristics, an energy range linked to the corresponding model pulse of each one of the at least two Markov variable ($r_k$) values.

5. A treatment method according to claim 4, wherein the constants of the vector (F) are proportional to a maximum predetermined amplitude ($A_{min}$) of the corresponding model pulse of the one of the at least two Markov variable ($r_k$) values, the energy range of the corresponding model pulse of the one of the at least two Markov variable ($r_k$) values being the lowest energy ranges defined by constants of the vector (F) that are each associated with one of the at least two Markov variable ($r_k$) values, wherein the one of the at least two Markov variable ($r_k$) values does not correspond to the "noise" mode.

6. A treatment method according to claim 1, wherein the state model includes a state vector ($X_k$) to be estimated, which includes a first component that corresponds to the non-noisy estimated digital signal ($s_k$), wherein a digitised representation of the initial analogue signal ($s_t$) at the instant (t) corresponds to the digital pitch (k), and wherein the determination, from the noisy temporal digital signal ($y_k$), of the non-noisy estimated digital signal ($s_k$) by means of the state model includes an intermediate stage of implementing a Kalman filter for observation of the noisy temporal digital signal ($y_k$), this intermediate stage supplying an intermediate estimate ($X_{k/k}$) of the state vector ($X_k$), thus including a non-noisy intermediate digital estimation signal ($s_{k/k}$) corresponding to a first determination of the non-noisy estimated digital signal ($s_k$).

7. A treatment method according to claim 6, wherein the determination, from the noisy temporal digital signal ($y_k$), of the non-noisy estimated digital signal ($s_k$) by means of the state model, includes a second intermediate stage of implementing a smoothing algorithm, with this second intermediate stage supplying an improved smoothed estimate ($X_{k/N}$) of the state vector ($X_k$), and therefore an improved smoothed estimate ($s_{k/N}$) of the non-noisy estimated digital signal ($s_k$).

8. A treatment method according to claim 1, wherein the at least two Markov variable ($r_k$) values are estimated by means of a Viterbi algorithm.

9. A treatment method according to claim 6, wherein the determination of the non-noisy estimated digital signal ($s_k$) is optimized based on a criterion of a Maximum A Posteriori (MAP).

10. A treatment method according to claim 9, wherein the criterion of the Maximum A Posteriori (MAP) is combined with an Expectation-Maximisation (EM) algorithm.

11. A treatment method according to claim 10, wherein the criterion of the Maximum A Posteriori combined with the Expectation-Maximisation (EM) algorithm is implemented:
for estimating the Markov variable ($r_k$)
for estimating the state vector ($X_k$), or
for estimating the Markov variable ($r_k$) and the state vector ($X_k$).

12. A treatment method according to claim 4 or 6, wherein the state model is expressed in the following form:

$$\begin{cases} X_{k+1} = A(r_{k+1})X_k + G(r_{k+1}) + B(r_{k+1})v_{k+1} \\ y_k = CX_k \end{cases}$$

Where:

$$X_k = \begin{pmatrix} s_k \\ b_k \\ n_k \end{pmatrix},$$

in which A is a state matrix, C is an observation matrix, $v_k$ is a Gaussian white-noise vector of unity variance, G is a vector that includes the constants of vector F, B is a dynamic noise matrix, $b_k$ is a bias, and $n_k$ is a noise that is intrinsic to a detector of the radiation used in the conditioning chain.

13. A treatment method according to claim 12, wherein the treatment method includes an initialisation stage in which the dynamic noise matrix B associated with the "noise mode" is equal to that associated with a least energetic pulse mode except the "noise mode", namely $$B(r_k=0)=B(r_k=1)$$

and in which, for the values of $r_k$ equal to or greater than 1, the matrix $B(r_k)$ is determined by $$B(r_k)=F(r_k)-F(r_{k-1}), \text{ where } r_k \geq 1.$$

14. A non-transitory memory having a computer program stored thereon, the computer program being configured, upon execution, for treating of a noisy temporal digital signal ($y_k$) with digital pitch (k), said noisy temporal digital signal ($y_k$) corresponding to an initial analogue signal ($s_t$) after it has been conditioned by a conditioning chain, with said initial analogue signal ($s_t$) including at least one pulse that is representative of information on radiation (30) coming from a radiation source, with this radiation (30) and the at least one pulse exhibiting an energy distribution, characterised in that the computer program includes instructions for implementation of the method according to claim 1.

15. A system for treatment of a noisy temporal digital signal ($y_k$) of digital pitch (k), said noisy temporal digital signal ($y_k$) corresponding to an initial analogue signal ($s_t$) after it has been conditioned by a conditioning chain, with said initial analogue signal ($s_t$) including at least one pulse that is representative of information on radiation coming from a radiation source, with this radiation and the at least one pulse exhibiting an energy distribution, wherein the system includes a detector, a conditioning chain, a computing unit and means that are designed to cooperate with a state model that is representative of said conditioning imposed by the conditioning chain in order to determine, from the noisy temporal digital signal ($y_k$), a non-noisy estimated digital signal ($s_k$), and wherein the state model includes a Markov variable ($r_k$) to be estimated, said Markov variable ($r_k$) being able to take at least two values, each of the at least two Markov variable ($r_k$) values being used to determine physical characteristics of a corresponding model pulses, with each model pulses constituting a possible representation, or at least closely approaching a possible representation, of the at least one pulse in the initial analogue signal ($s_t$).

16. A spectrometer that includes means that are designed to implement a method according to claim 1.

17. A bolometer that includes means that are designed to implement a method according to claim 1.

* * * * *